(12) United States Patent
Lu et al.

(10) Patent No.: US 9,537,016 B1
(45) Date of Patent: Jan. 3, 2017

(54) MEMORY DEVICE, GATE STACK AND METHOD FOR MANUFACTURING THE SAME

(71) Applicant: TAIWAN SEMICONDUCTOR MANUFACTURING COMPANY LTD., Hsinchu (TW)

(72) Inventors: Hau-Yan Lu, Hsinchu (TW); Chun-Yao Ko, Hsinchu (TW); Chun-Heng Liao, Taipei County (TW); Felix Ying-Kit Tsui, Cupertino, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/014,858

(22) Filed: Feb. 3, 2016

(51) Int. Cl.
*H01L 29/792* (2006.01)
*H01L 29/51* (2006.01)
*H01L 29/66* (2006.01)
*H01L 21/28* (2006.01)

(52) U.S. Cl.
CPC ....... *H01L 29/792* (2013.01); *H01L 21/28282* (2013.01); *H01L 29/513* (2013.01); *H01L 29/518* (2013.01); *H01L 29/66833* (2013.01)

(58) Field of Classification Search
CPC  H01L 29/792; H01L 21/28282; H01L 29/511; H01L 29/513; H01L 29/518; H01L 29/66833
USPC .......................................... 257/324–326, 411
See application file for complete search history.

(56) References Cited

U.S. PATENT DOCUMENTS

| | | | |
|---|---|---|---|
| 8,222,688 B1* | 7/2012 | Jenne ..................... | G11C 16/04 257/324 |
| 2002/0185711 A1* | 12/2002 | Lin ........................ | C23C 16/029 257/635 |
| 2006/0113586 A1* | 6/2006 | Wang .................... | H01L 29/513 257/324 |
| 2008/0272424 A1* | 11/2008 | Kim ................... | H01L 21/28282 257/321 |
| 2008/0293207 A1* | 11/2008 | Koutny, Jr. ....... | H01L 21/82341 438/306 |
| 2010/0157680 A1* | 6/2010 | Higuchi ............ | H01L 21/28282 365/185.18 |
| 2011/0101442 A1* | 5/2011 | Ganguly ........... | H01L 21/28282 257/324 |

* cited by examiner

*Primary Examiner* — Benjamin Sandvik
*Assistant Examiner* — Herve Assouman
(74) *Attorney, Agent, or Firm* — WPAT, P.C., Intellectual Property Attorneys; Anthony King

(57) ABSTRACT

A memory device is disclosed. The memory device includes a substrate, including a substrate, including a source region and a drain region; and a gate stack, formed over a surface of the substrate, wherein the gate stack includes: a tunneling layer; a first layer; a second layer; a third layer; and a blocking layer; wherein each of the tunneling layer and the blocking layer has an oxygen proportion higher than the first, the second and the third layers; the first layer has a highest silicon proportion among the first, the second and the third layers; the second layer has a highest oxygen proportion among the first, the second and the third layers; and the first layer has a highest nitrogen proportion among the first, the second and the third layers. An associated gate stack and a manufacturing method are also disclosed.

20 Claims, 12 Drawing Sheets

MEMORY DEVICE, GATE STACK AND METHOD FOR MANUFACTURING THE SAME

BACKGROUND

It is highly desirable to scale down erase voltages of a Silicon-Oxide-Nitride-Oxide-Silicon (SONOS) memory device, which has typically been achieved by decreasing the thickness of the tunneling oxide layer. However, conventional SONOS memory device has a conductive storage layer, and thus thin tunneling oxide layers will cause a significant leakage problem. Stored charges are more likely to be leaked to the substrate through a thin tunneling oxide layer than through a thick one.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
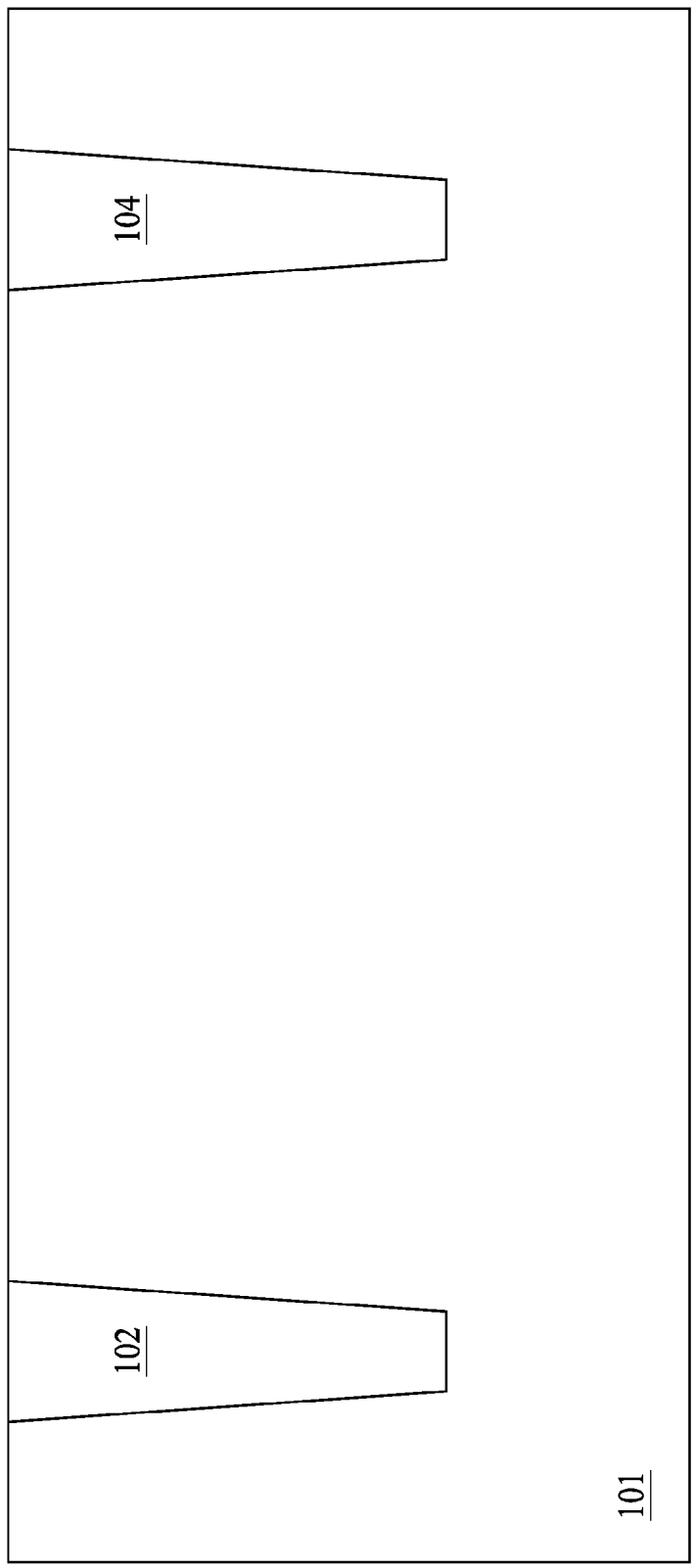
FIG. 1 illustrates isolation regions formed in a substrate in order to isolate active regions of the the substrate in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIGS. 1 through 9 are schematic cross-sectional diagrams formed by various fabrication steps in a Silicon-Oxide-Nitride-Oxide-Silicon (SONOS) memory device manufacturing process in accordance with some embodiments of the present disclosure. Details of the erase operation and the retention state of the SONOS memory device will be provided later on in paragraphs pertinent to FIGS. 10 through 11.

The following description is described with reference to FIGS. 1 through 9 unless otherwise provided. FIG. 1 illustrates isolation regions 102 and 104 formed in a substrate 101 in order to isolate active regions of the the substrate 101 in accordance with some embodiments. The substrate 101 is, for example, a bulk silicon substrate. Alternatively, the substrate 101 is comprised of an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrate 101 also includes a silicon-on-insulator (SOI) substrate. SOI substrates are fabricated using separation by implantation of oxygen (SIMOX), wafer bonding, and/or other suitable methods.

The substrate 101 can include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions are, for example, formed directly on the substrate 101, in a P-well structure, in an N-well structure, in a dual-well structure, or using a raised structure. The semiconductor substrate 101 can further include various active regions, such as regions configured for an N-type metal-oxide-semiconductor transistor device and regions configured for a P-type metal-oxide-semiconductor transistor device.

The isolation regions 102 and 104 utilize isolation technology, such as shallow trench isolation (STI), to define and electrically isolate the various regions. The isolation regions 102 and 104 include silicon oxide, silicon nitride, silicon oxynitride, an air gap, other suitable materials, or combinations thereof. The isolation regions 102 and 104 are formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. The trenches may be partially filled, as in the present embodiment, where the substrate remaining between trenches forms a fin structure. In some examples, the filled trench may have a multi-layer structure such as a thermal oxide liner layer filled with silicon nitride or silicon oxide.

In one embodiment, the substrate 101 is formed of a bulk material such as silicon. In alternative embodiments, the substrate 101 has a structure of silicon-on-insulator (SOI) with a semiconductor layer on a buried oxide (BOX) layer, which is further located on a semiconductor layer. In further embodiments, strained-Si on insulator (SSOI) may be used.

Figure 2:
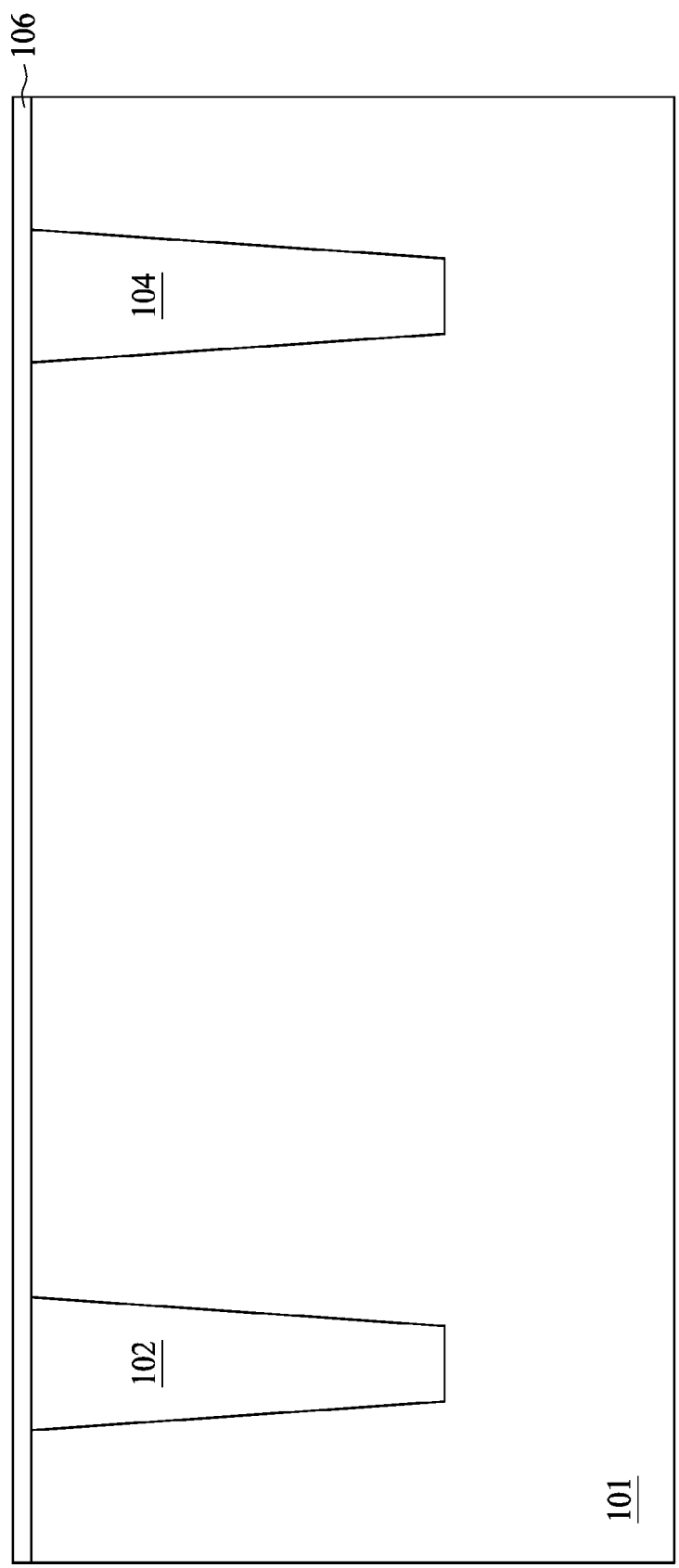
FIG. 2 illustrates a tunneling layer formed over the substrate in accordance with some embodiments.

FIG. 2 illustrates a tunneling layer 106 formed over the substrate 101 in accordance with some embodiments. The tunneling layer 106, also referred to as a hole tunneling layer or a tunneling dielectric layer, is comprised of oxide, such as silicon oxide or silicon dioxide, formed by thermal oxidation on the surface of the substrate 101. In some embodiment, the thickness of the tunneling layer 106 is less than about 20 Å, and preferably about 15 Å or less. In this embodiment, the tunneling layer 106 has a low leakage of charges. Accordingly, the tunneling layer 106 preferably has a high conduction band edge, so that a barrier height $\Phi_{B1}$ (labeled in FIG. 10) of the tunneling layer 106, which is the difference between the conduction band edge of the tunneling layer 106 and the conduction band edge of the substrate 101, is high. The barrier height $\Phi_{B1}$ is preferably greater than about 2 eV. The tunneling layer 106 is formed through a chemical vapor deposition (CVD) operation, a low-pressure chemical vapor deposition (LPCVD) operation or an atomic layer deposition (ALD) operation or the like.

Figure 3:
FIG. 3 illustrates a silicon-rich layer formed over the tunneling layer in accordance with some embodiments.

In this embodiment, the SONOS memory device has a more complicated structure compared with an existing SONOS-type memory structure. The silicon nitride layer, also referred to as a storage layer or a charge trapping layer, of the existing SONOS-type memory structure includes three layers with distinct compositions, including a silicon-rich layer 108 (labeled in FIGS. 3 through 9), an oxygen-rich layer 110 (labeled in FIGS. 4 through 9) and a nitrogen-rich layer 112 (labeled in FIGS. 5 through 9). FIG. 3 illustrates the silicon-rich layer 108 formed over the tunneling layer 106 in accordance with some embodiments. The silicon-rich layer 108 is the bottom layer of the three layers 108 through 112 of the SONOS memory device of the present disclosure. The silicon-rich layer 108 has a proportion of silicon in a range of about 20-50 atomic percent. In some embodiments, the silicon-rich layer 108 is formed through the CVD), the LPCVD or the ALD operations or the like.

The silicon-rich layer 108 has a thickness greater than about 5 Å and/or less than about 30 Å. An advantageous feature for using a silicon-rich material is that a valence band edge $E_{VB1}$ (labeled in FIG. 10) of the silicon-rich layer 108 is high compared with those of other two silicon oxynitride layers, i.e. the oxygen-rich nitride layer 110 and the nitrogen-rich nitride layer 112. In other words, a valence band edge difference between the silicon-rich layer 108 and the substrate 101 (hereinafter $|E_{VB1}-E_{VBS}|$) is controlled to be smaller than the valence band edge differences $|E_{VB2}-E_{VBS}|$ and $|E_{VB3}-E_{VBS}|$, in accordance with some embodiments. As known in the art, there are two typical tunneling mechanisms, the Fowler-Nordheim (FN) tunneling and the direct tunneling. The FN tunneling is typically associated with the barrier height, while the direct tunneling is often associated with the thickness of the barrier layer. With a low barrier height, the FN tunneling of charges through the silicon-rich layer 108 is easier, and the efficiency of an erase operation can be improved. The thickness of the silicon-rich layer 108 is relatively small compared with the oxygen-rich nitride layer 110 and the nitrogen-rich nitride layer 112 of the silicon oxynitride layer, thereby increasing a chance of the direct tunneling and further improving the efficiency of the erase operation.

Figure 4:
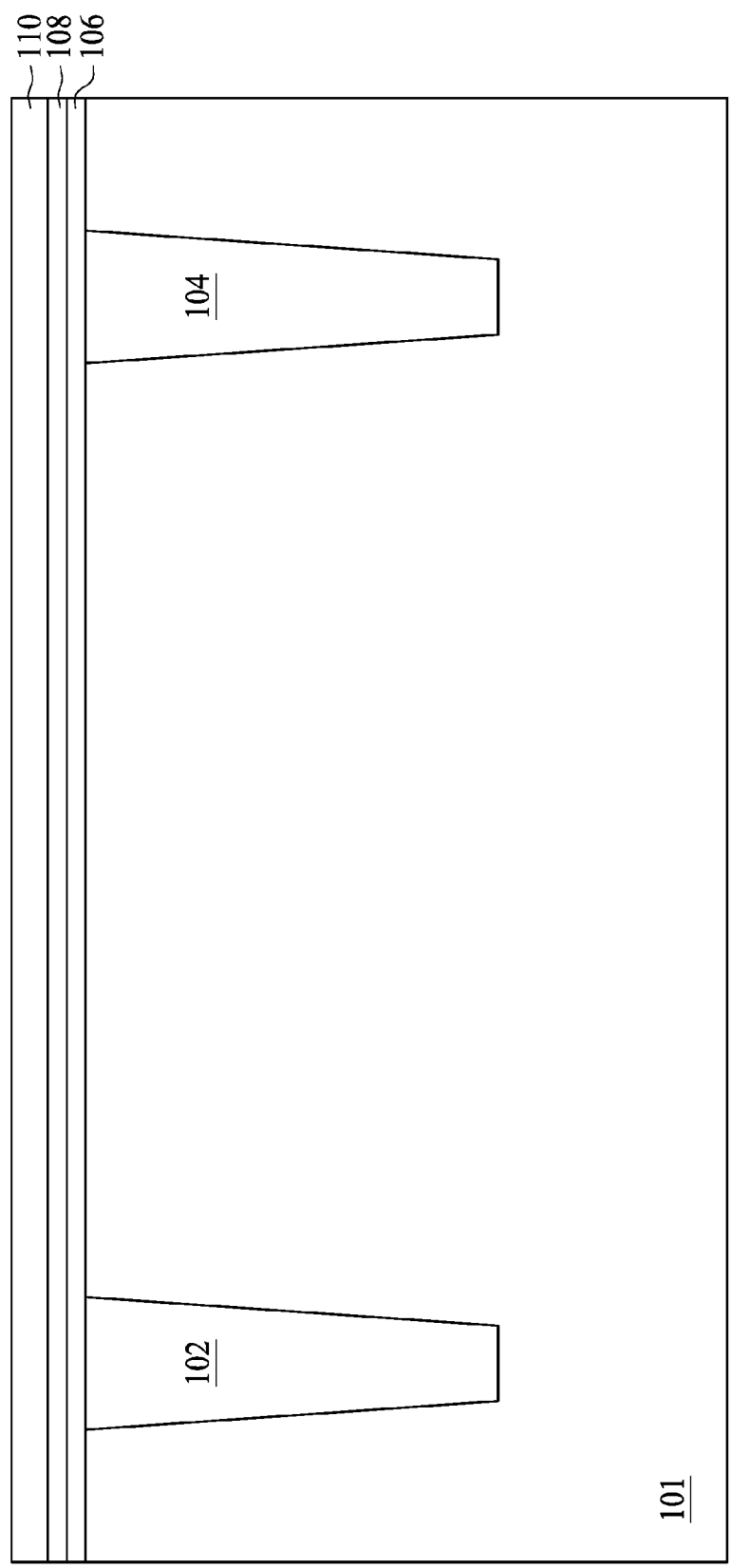
FIG. 4 illustrates an oxygen-rich layer formed over the silicon-rich layer in accordance with some embodiments.

FIG. 4 illustrates the oxygen-rich layer 110 formed over the silicon-rich layer 108 in accordance with some embodiments. The oxygen-rich layer 110 is the middle layer of the three layers 108 through 112 of the SONOS memory device of the present disclosure. The oxygen-rich layer 110 has a proportion of oxygen a range of about 15-50 atomic percent. In some embodiments, the oxygen-rich layer 110 is formed through the CVD, the LPCVD or the ALD operations or the like similar to the silicon-rich layer 108.

The oxygen-rich layer 110 has a thickness greater than about 10 Å and/or less than about 50 Å. An advantageous feature for using an oxygen-rich material is that a valence band edge $E_{VB2}$ (labeled in FIG. 10) of the oxygen-rich layer 110 is typically low compared with other two silicon nitride layer, i.e. the silicon-rich layer 108 and the nitrogen-rich nitride layer 112. In other words, a valence band edge difference between the oxygen-rich layer 110 and the substrate 101 (hereinafter $|E_{VB2}-E_{VBS}|$) is controlled to be larger than the valence band edge differences $|E_{VB1}-E_{VBS}|$ and $|E_{VB3}-E_{VBS}|$, in accordance with some embodiments. As known in the art, with a high valence band edge difference (barrier height), excellent retention characteristics can be achieved. The thickness of the oxygen-rich layer 110 is substantially between the silicon-rich layer 108 and the nitrogen-rich layer 112 of the silicon nitride layer.

Figure 5:
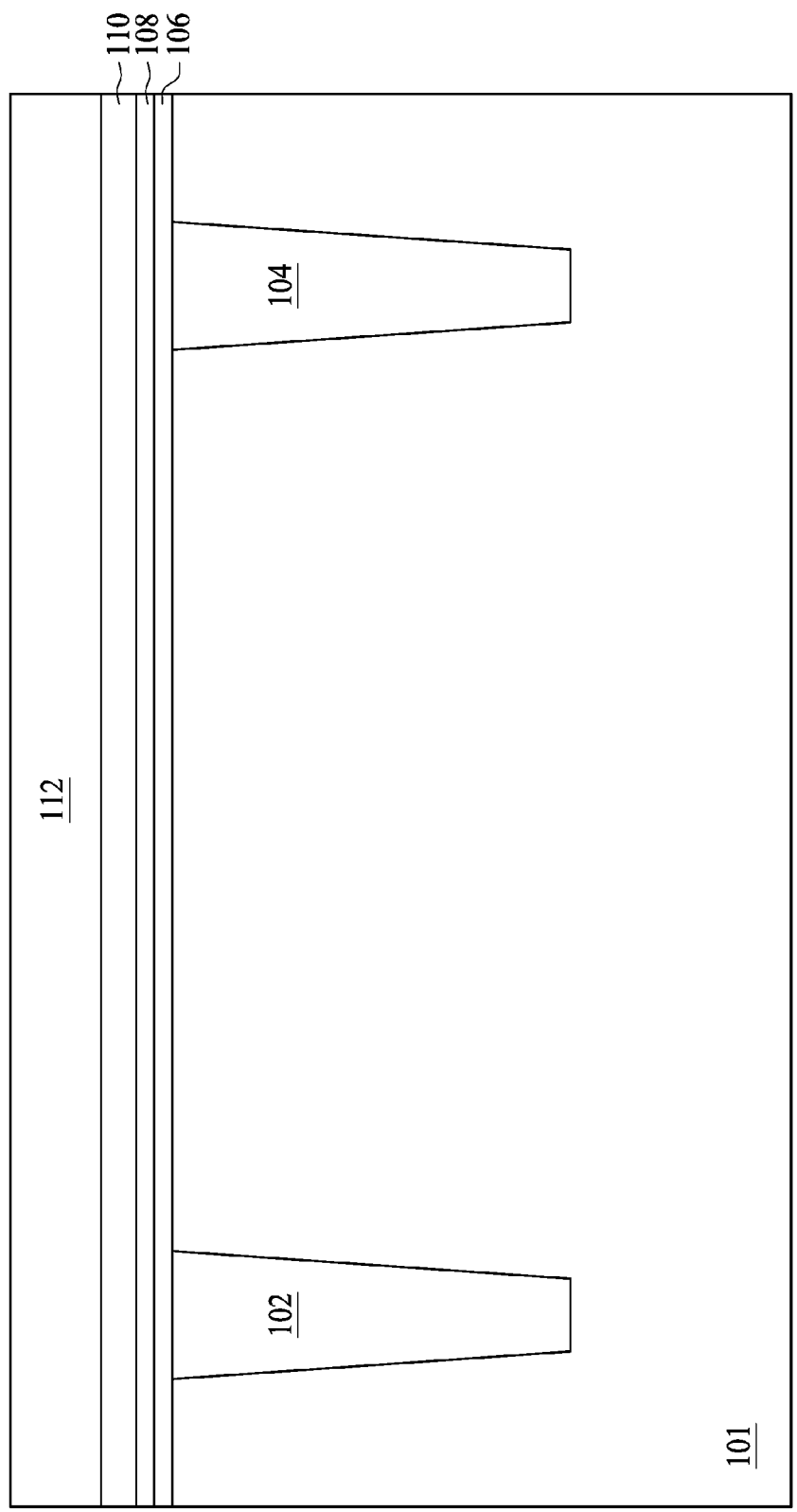
FIG. 5 illustrates a nitrogen-rich layer formed over the oxygen-rich layer in accordance with some embodiments.

FIG. 5 illustrates the nitrogen-rich layer 112 formed over the oxygen-rich layer 110 in accordance with some embodiments. The nitrogen-rich layer 112 is the top layer of the three layers 108 through 112 of the SONOS memory device of the present disclosure. A conduction band edge $E_{CB3}$ (labeled in FIG. 10) of the nitrogen-rich layer 112 is between the other two silicon nitride layer, i.e. the silicon-rich layer 108 and the oxygen-rich nitride layer 110. In this embodiment, the nitrogen-rich layer 112 is a dielectric layer with a high trap density such as charge trapping materials silicon oxynitride ($Si_xO_yN_z$). The nitrogen-rich layer 112 has a proportion of oxygen and silicon less than about 30 atomic percent respectively. In some embodiments, the nitrogen-rich layer 112 is formed through the CVD, the LPCVD or the ALD operations or the like similar to the silicon-rich layer 108 and the oxygen-rich layer 110. With the nitrogen-rich layer 112, charges are stored therein around traps, and thus two, or even four, bits can be stored in one cell (multi-level cells).

Figure 6:
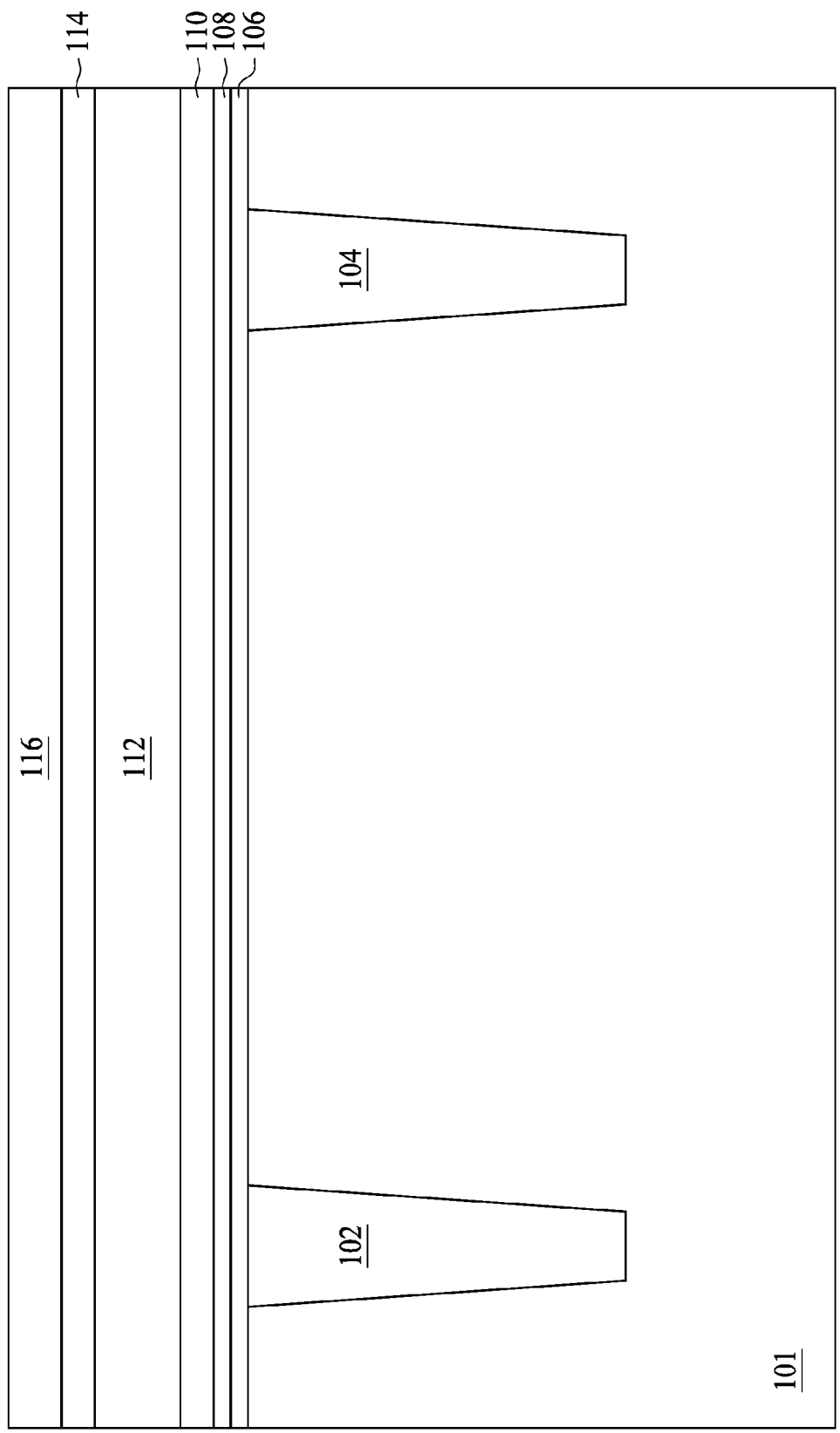
FIG. 6 illustrates a blocking layer and a gate electrode layer formed over the nitrogen-rich layer in accordance with some embodiments.

FIG. 6 illustrates a blocking layer 114 and a gate electrode layer 116 formed over the nitrogen-rich layer 112 in accordance with some embodiments. In this embodiment, the blocking layer 114 has a low leakage of charges. Accordingly, the blocking layer 114 preferably has a high conduction band edge, so that a barrier height $\Phi_{B2}$ of the blocking layer 114, which is the difference between the conduction band edge of the blocking layer 114 and the conduction band edge of the subsequently formed gate electrode layer 116, is high. The barrier height $\Phi_{B2}$ is preferably greater than about 1.2 eV. In this embodiment, the blocking layer 114 is comprised of oxide, such as silicon oxide or silicon dioxide, formed by thermal oxidation on the nitrogen-rich layer 112. Commonly used methods such as the CVD, the LPCVD or the ALD operations, and the like can be employed to produce the blocking layer 114.

The gate electrode layer 116 in this embodiment includes p+ or N+ polysilicon. Other embodiments employ metals, metal compounds or combinations of metals and metal compounds for the gate electrode layer 116, such as iridium (Ir), platinum (Pt), nickel (Ni), palladium (Pd), rhodium (Rh), tantalum nitride (TaN), metal silicides, aluminum (Al) or other metal or metal compound gate materials. For some applications, it is preferable to use materials having high work functions. A higher work function also helps increase the barrier height $\Phi_{B2}$, thus reducing the undesirable FN tunneling through the blocking layer 114, which results in leakage and replenish of charges into the nitrogen-rich layer 112 during the erase operations. An exemplary method for depositing the gate electrode layer 116 includes sputtering or physical vapor deposition (PVD). In other embodiments, the gate electrode layer 116 includes conductive metal oxides and/or metal oxynitrides.

Figure 7:
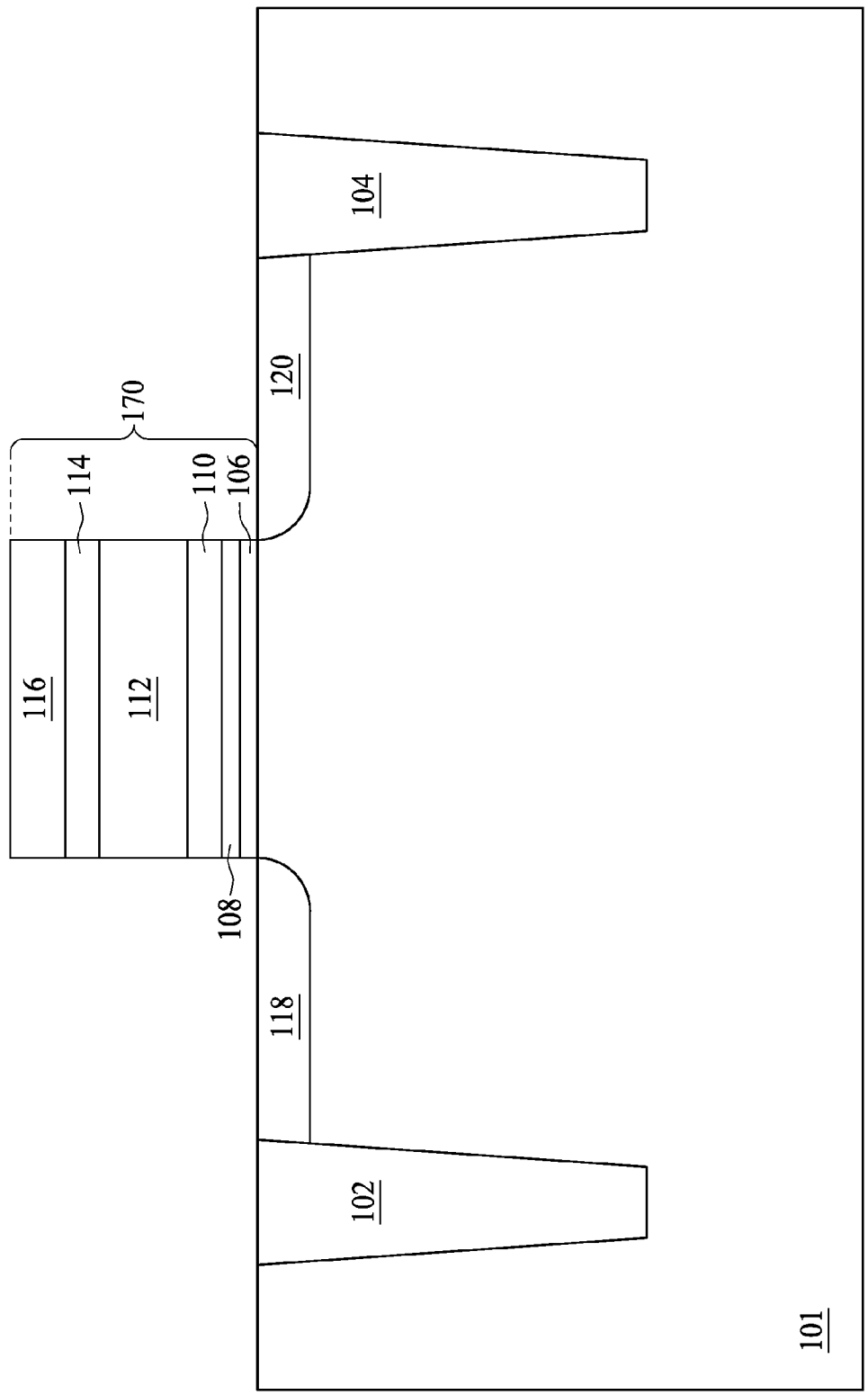
FIG. 7 illustrates patterned stacked layers in accordance with some embodiments.

FIG. 7 illustrates patterned stacked layers 106-116 in accordance with some embodiments. The stacked layers 106 through 116 are then patterned, forming a gate stack 170 between the isolation regions 102 and 104 as shown in FIG. 7. Lightly doped regions (LDD) 118 and 120 are formed at two sides of the gate stack 170, for example, by implanting an n-type impurity. The gate stack 170 serves as a self-aligning mask so that the LDD regions 118 and 120 are substantially aligned with the edges of the gate stack 170.

Figure 8:
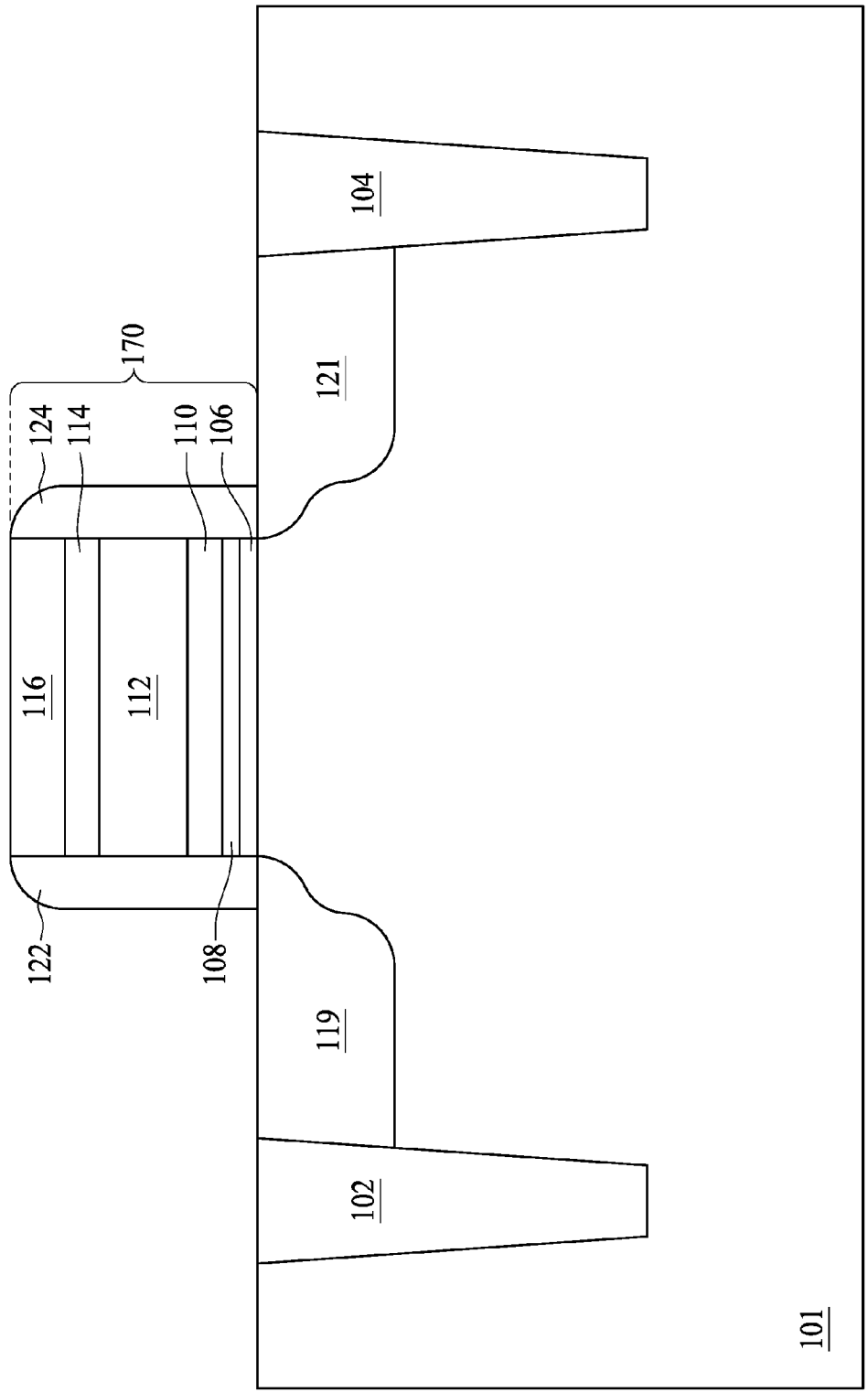
FIG. 8 illustrates spacers formed at sidewalls of the gate stack and source/drain regions formed around LDD regions in accordance with some embodiments.

FIG. 8 illustrates spacers 122, 124 formed over sidewalls of the gate stack 170 and source/drain regions 119 and 121 formed around the LDD regions 118 and 120 in accordance with some embodiments. The spacers 122 and 124 can be formed by well-known methods such as blanket depositing a dielectric layer over the entire region, anisotropically etching to remove the dielectric layer from the horizontal surfaces, and leaving the spacers 122 and 124. The source/drain regions 119 and 121 can be formed by implanting an n-type impurity. By masking the gate stack 170 and the gate spacers 122 and 124, the source/drain regions 119 and 121 are substantially aligned to the edges of the gate spacers 122 and 124.

Figure 9:
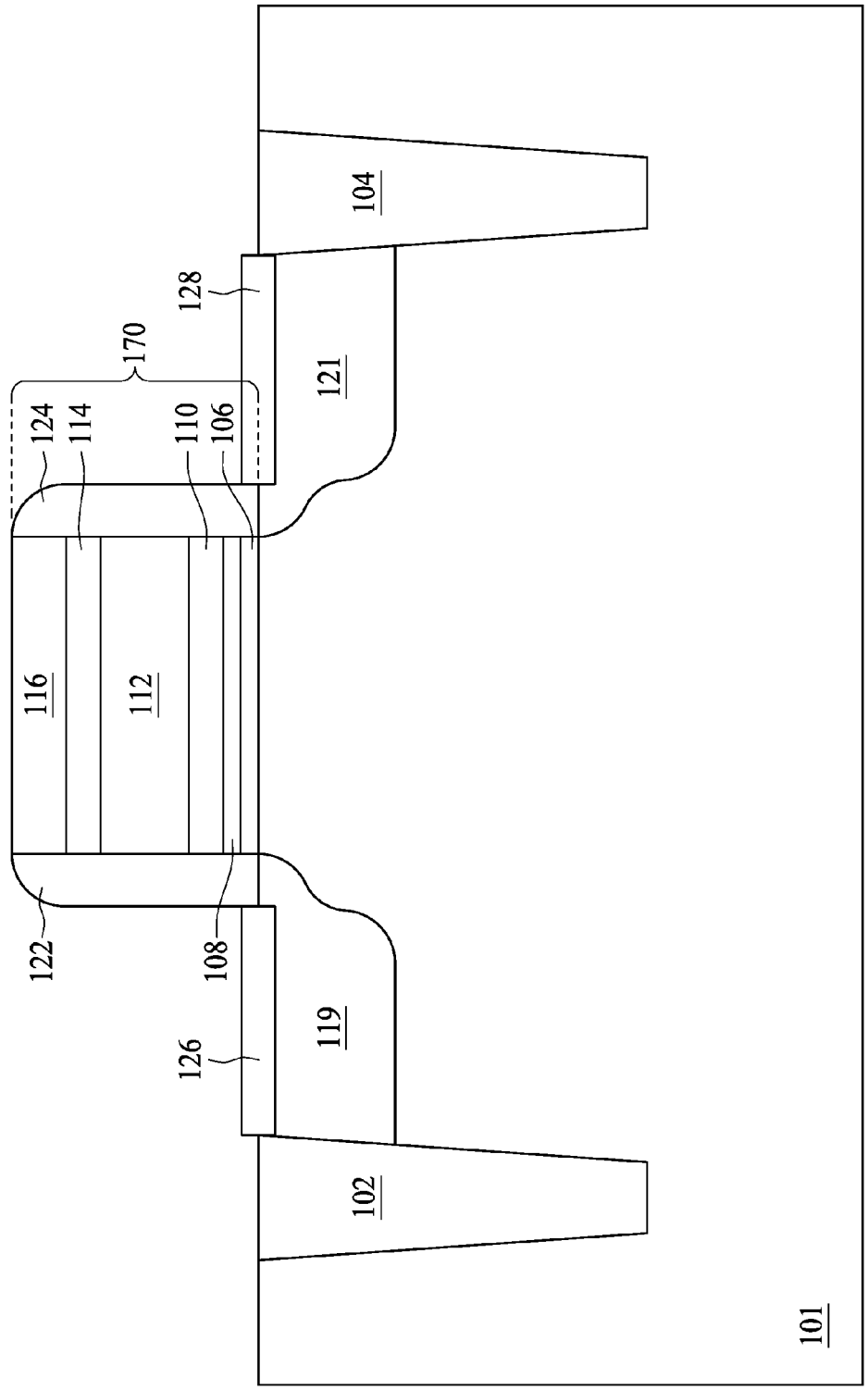
FIG. 9 illustrates silicide regions over the source/drain regions in accordance with some embodiments.

FIG. 9 illustrates silicide regions 126 and 128 over the source/drain regions 119 and 121 in accordance with some embodiments. To form the silicide regions 126 and 128, a metal layer is formed by depositing a thin layer of metal, such as cobalt, nickel, erbium, molybdenum, platinum, and the like, over the device. An anneal operation is employed to form silicide regions 126 and 128 between the deposited metal and the underlying exposed silicon regions. Excess metal is removed to obtain the profile of the silicide regions 126 and 128 shown in FIG. 9.

Figure 10:
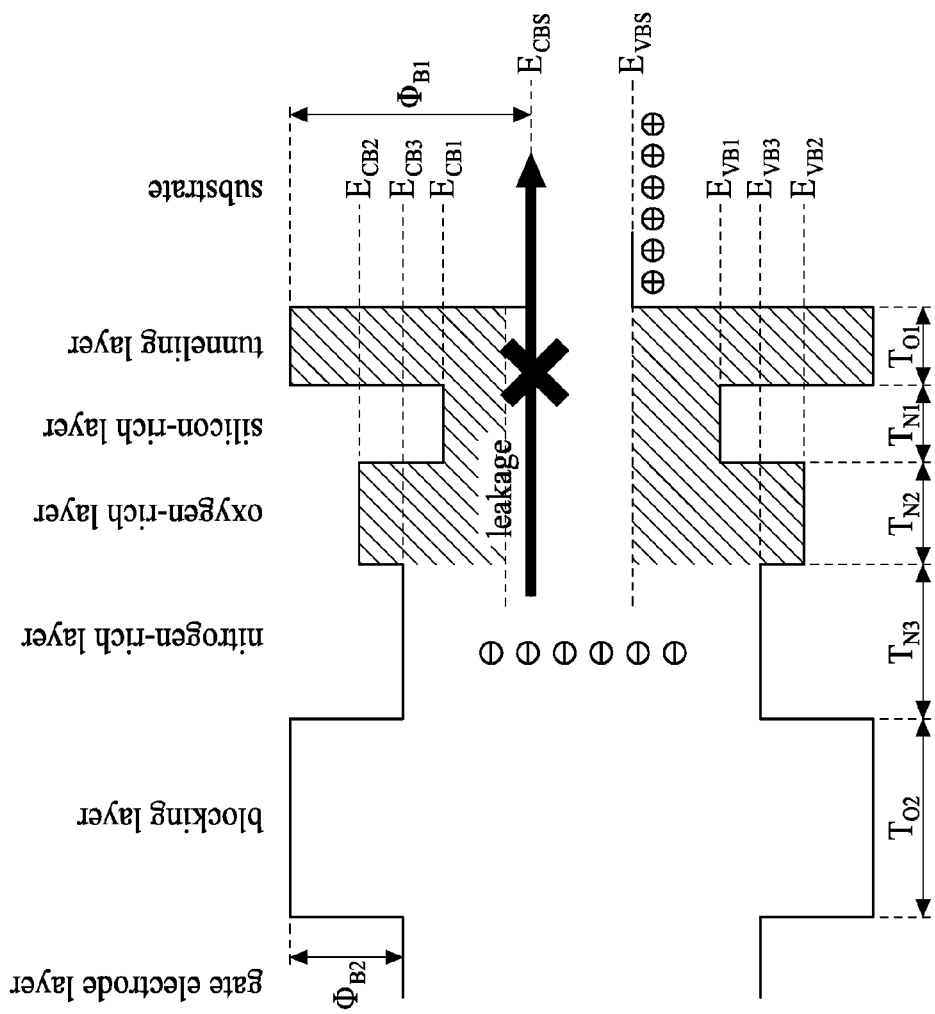
FIG. 10 illustrates a band diagram showing energy levels of the conduction and valence bands of a SONOS memory device including the stacked layers of FIG. 9 under a low electric field in accordance with some embodiments.

The following description is described with reference to FIGS. 10 through 11 unless otherwise provided. FIG. 10 illustrates a band diagram showing energy levels of the conduction and valence bands of a SONOS memory device including the stacked layers 101 through 116 of FIG. 9 under a low electric field in accordance with some embodiments of the present disclosure. The arrangement of the silicon-rich layer 108, the oxygen-rich layer 110, and the nitrogen-rich layer 112 provided in the present disclosure is to prevent trapped electrons in the nitrogen-rich layer 112 from leaking to the substrate under low electric field condition. Alternatively stated, the arrangement is also to prevent holes in the substrate from tunneling into the nitrogen-rich layer 112 and annihilate the trapped electrons under low electric field condition. The stacked layers 101 through 116 of FIG. 9 include the substrate 101, the tunneling layer 106, the silicon-rich layer 108, the oxygen-rich layer 110, the nitrogen-rich layer 112, the blocking layer 114 and the gate electrode layer 116. A stepped line depicted in an upper part of the band diagram shows a conduction band edge; and another stepped line depicted in a lower part of the band diagram shows a valence band edge.

From the right side to the left side, band gaps for the substrate, the tunneling layer, the silicon-rich layer, the oxygen-rich layer, the nitrogen-rich layer, the blocking layer and the gate electrode layer are shown, wherein the band gaps are different in each layer. The conduction band edge of the tunneling layer, the silicon-rich layer and the oxygen-rich layer together shows a substantially "U-shaped" profile; and the valence band edge of the tunneling layer, the silicon-rich layer and the oxygen-rich layer together show a substantially "inverted U-shaped" profile. Electrons, represented by the circles with the negative signs, are trapped within the nitrogen-rich layer since a write operation performed thereupon last time. In a normal condition where, for example, the electric field applied to the SONOS memory device and/or the ambience temperature are within a specific threshold voltage or degree, electrons trapped within the nitrogen-rich layer are substantially unable to tunnel to the conduction band of the substrate. It is because the conduction band edge of the tunneling layer and the oxygen-rich layer remains high relative to the trap energy level in the nitrogen-rich layer.

In FIG. 10, the likelihood of electron tunneling correlates with the area under the "U-shaped" conduction band and above a horizontal line at an energy level of the trap to the substrate (the area is marked by oblique lines). Thus, trapped electrons in the nitrogen-rich layer 112 are much unlikely to tunnel to the substrate at low field conditions. Likewise, holes in the valence band of the substrate are blocked by the full thickness of the tunneling layer, the silicon-rich layer and the oxygen-rich layer from tunneling to the trapping layer, i.e. the nitrogen-rich layer. In addition, hole tunneling is also hindered by a high hole tunneling barrier at an interface between the substrate and the tunneling layer. The likelihood of hole tunneling correlates with the area over the "inverted U-shaped" valence band and below a horizontal line at the energy level of the substrate to the nitrogen-rich layer (the area is marked by oblique lines). Thus, hole tunneling is very unlikely at low field conditions.

As mentioned in the previous paragraphs regarding FIGS. 1 through 9, the tunneling layer 106 is comprised of oxide, such as silicon oxide or silicon dioxide. The tunneling layer 106 possesses a high hole tunneling barrier which prevents hole tunneling from the substrate 101 to the nitrogen-rich layer 112. Besides, the valence band edge in the silicon-rich layer 108, the oxygen-rich layer 110 and the nitrogen-rich layer 112 remains significantly below that of the valence band edge in the substrate 101. The tunneling layer 106 described herein therefore is characterized by band offset characteristics, include a relatively large hole tunneling barrier in a relatively thin region with a thickness $T_{O1}$ at the interface between the substrate 101 and the silicon-rich layer 108.

The silicon-rich layer 108 having a thickness $T_{N1}$ and featured by a relatively high valence band edge is located between the tunneling layer 106 and the oxygen-rich layer 110. The oxygen-rich layer 110 is featured by a decrease in valence band edge, resulting in the inverted U-shaped valence band shape. Likewise, the conduction band has a U-shape caused by the same selection of materials. Since the stacked layers 108 through 112 employed in the embodiments act as a replacement of a storage layer or a charge trapping layer in an existing SONOS-type memory structure, the entire thickness of the stacked layers 108 through 112, i.e. a sum of the thickness $T_{N1}$, $T_{N2}$ and $T_{N3}$ is preferred to substantially the same or similar to a thickness of the storage layer or the charge trapping layer in the existing SONOS-type memory structure.

To control the sum of the thickness $T_{N1}$, $T_{N2}$ and $T_{N3}$ to not too much exceeding the thickness of the storage layer or the charge trapping layer in the existing SONOS-type memory structure can prevent the electric field across the stacked layers 101 through 116 from being significantly decreased. Please note that the electric field across the stacked layers 101 through 116 has to be higher than a specific threshold value when performing an erase operation. So too much increasing the entire thickness $T_{N1}$, $T_{N2}$ and $T_{N3}$ can deteriorate the efficiency of an erase operation performed thereupon. Descriptions regarding the erase operation will be described later on in the following paragraphs pertinent to FIG. 11.

The oxygen-rich layer 110 isolates the silicon-rich layer 108 from the nitrogen-rich layer 112. This increases the effective blocking capability during low electric field for both electrons and holes, improving charge retention. The silicon-rich layer 108 in this embodiment must be thin enough that it has negligible charge trapping efficiency. In some embodiments, the oxygen-rich layer 110 has a thickness $T_{N2}$ which is substantially thicker than the silicon-rich layer 108, thereby lowering the leakage and prolonging the retention time of the resulting SONOS memory device. The nitrogen-rich layer 112 has a thickness $T_{N3}$ which is substantially thicker than the oxygen-rich layer 110 and the silicon-rich layer 108 in order to provide enough amounts of trap.

In accordance with some embodiments of the present disclosure, a relationship between the thickness of each of the stacked layers 108 through 112 can be represented as $T_{N3} > T_{N2} > T_{N1}$. However, this is not a limitation of the present disclosure, in some embodiments, the relationship can be $T_{N3} > T_{N1} > T_{N2}$. In accordance with some embodiments of the present disclosure, a relationship between a trap density $D_{TN1}$ of the silicon-rich layer 108, a trap density $D_{TN2}$ of the oxygen-rich layer 110, a trap density $D_{TN3}$ of the nitrogen-rich layer 112 can be represented as $DT_{N3} > DT_{N1} > DT_{N2}$.

Figure 11:
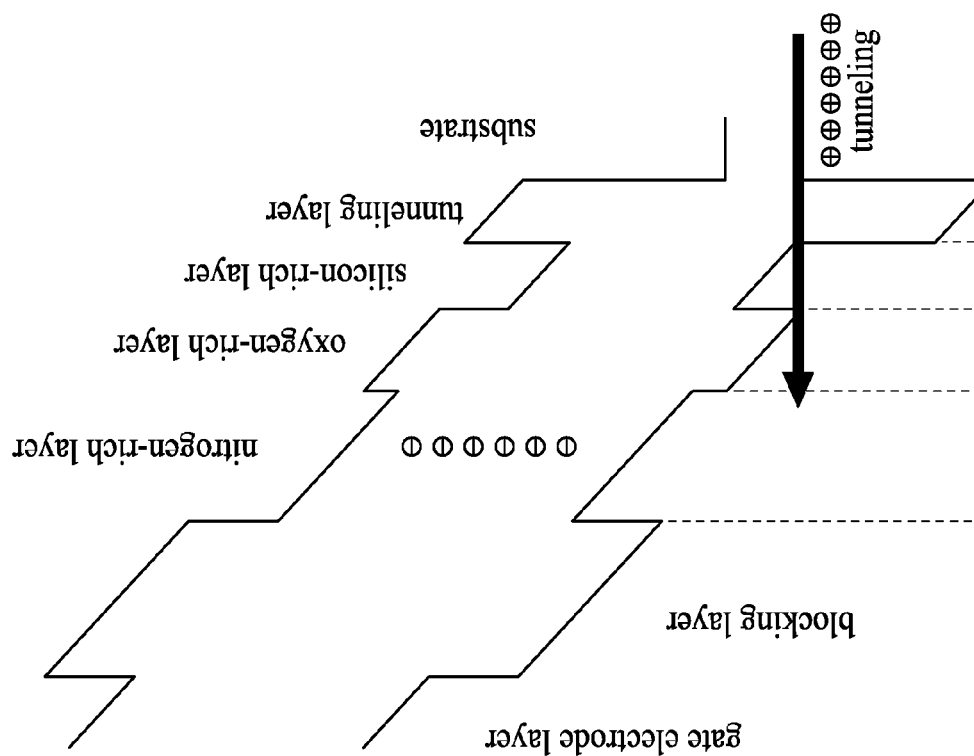
FIG. 11 illustrates a band diagram showing energy levels of the conduction and valence bands of the SONOS memory device including the stacked layers of FIG. 9 under an electric field of about −7 to about 10 MV/cm in the tunneling layer in accordance with some embodiments.

FIG. 11 illustrates a band diagram showing energy levels of the conduction and valence bands of the SONOS memory device including the stacked layers 101 through 116 of FIG. 9 under an electric field of about −7 to about 10 MV/cm in the tunneling layer 106 in accordance with some embodiments of the present disclosure. The electric field is for the purposes of inducing hole tunneling. Under certain electric field where a positive potential is in contact with the substrate side and a negative potential is in contact with the electrode side, the bands are tilted as shown in FIG. 11. Therefore, the FN tunneling probability for holes in the substrate is increased substantially. The arrangement of the silicon-rich layer 108, the oxygen-rich layer 110, and the nitrogen-rich layer 112 provided in the present disclosure is to facilitate the hole tunneling from the substrate through the tunneling layer and successfully reach the nitrogen-rich layer in order to annihilate the trapped electrons under high electric field condition.

As can be seen in FIG. 11, due to the existence of the silicon-rich layer 108, the valence band edge of the oxygen-rich layer 110 can be further lifted up and the lowest valence band edge thereof is substantially level up with the substrate valence band edge. As such, the hindrance to hole tunneling can be significantly reduced, thereby allowing a large hole tunneling current under relatively small electric fields in accordance with some embodiments of the present disclosure.

Figure 12:
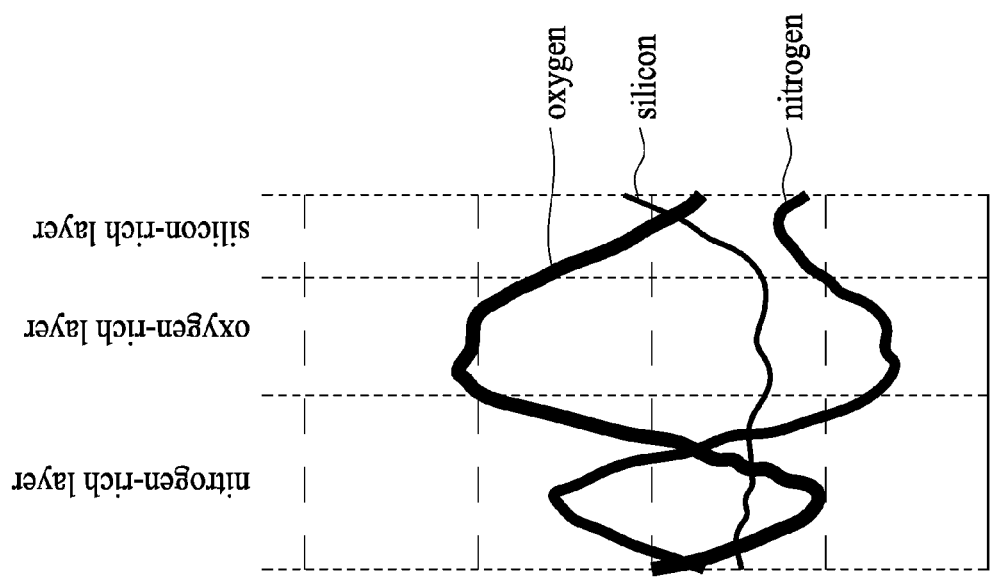
FIG. 12 illustrates a composition diagram of the SONOS memory device including the silicon-rich layer, the oxygen-rich layer and the nitrogen-rich layer in accordance with some embodiments.

FIG. 12 illustrates a composition diagram of the SONOS memory device including the silicon-rich layer 108, the oxygen-rich layer 110 and the nitrogen-rich layer 112 in accordance with some embodiments of the present disclosure. The composition diagram at least provides a relative relationship between the three layers 108 through 112. As shown in FIG. 12, the nitrogen-rich layer 112 has the highest proportion of nitrogen, the silicon-rich layer 108 has the second highest proportion of nitrogen, and the oxygen-rich layer 110 has the lowest proportion of nitrogen. The proportion of nitrogen correlates with the trap density described in above paragraphs. Regarding the proportion of silicon, the silicon-rich layer 108 has the highest proportion of silicon, the nitrogen-rich layer 112 has the second highest proportion of silicon, and the oxygen-rich layer 110 has the lowest proportion of silicon. The proportion of silicon correlates with the band gaps. Moreover, regarding the proportion of oxygen, the oxygen-rich layer 110 has the highest proportion of silicon, the silicon-rich layer 108 has the second highest proportion of silicon, and the nitrogen-rich layer 112 has the lowest proportion of silicon.

The embodiments of the present disclosure have several advantageous features. The leakage is low, and thus the retention time of the resulting non-volatile memory such as a flash memory device is long. The erase voltage is reduced, thus an additional advantageous feature includes fast erase operation. The manufacturing process of the disclosed SONOS memory device can be easily integrated into existing complementary metal oxide semiconductor (CMOS) processes.

Some embodiments of the present disclosure provide a memory device, including: a substrate, including a source region and a drain region; and a gate stack, formed over a surface of the substrate, wherein the gate stack includes: a tunneling layer; a first layer; a second layer; a third layer; and a blocking layer; wherein each of the tunneling layer and the blocking layer has an oxygen proportion higher than the first, the second and the third layers; the first layer has a highest silicon proportion among the first, the second and the third layers; the second layer has a highest oxygen proportion among the first, the second and the third layers; and the first layer has a highest nitrogen proportion among the first, the second and the third layers.

In some embodiments of the present disclosure, the memory device further includes a gate electrode layer over the blocking layer.

In some embodiments of the present disclosure, the memory device further includes spacers formed over sidewalls of the gate stack.

In some embodiments of the present disclosure, the third layer is the thickest layer among the first, the second and the third layers.

In some embodiments of the present disclosure, the first layer is the thinnest layer among the first, the second and the third layers.

In some embodiments of the present disclosure, the first layer has a thickness in a range from about 5 Å to about 30 Å.

In some embodiments of the present disclosure, the second layer has a thickness in a range from about 10 Å to about 50 Å.

In some embodiments of the present disclosure, the third layer has a thickness greater than about 30 Å.

In some embodiments of the present disclosure, each of the first, the second and the third layers has a band gap between a conduction band and a valence band, and the band gap of the second layer is the largest among the band gaps of the first, the second and the third layers.

In some embodiments of the present disclosure, each of the first, the second and the third layers has a band gap between a conduction band and a valence band, and the band gap of the first layer is the smallest among the band gaps of the first, the second and the third layers.

Some embodiments of the present disclosure provide a gate stack, including: a tunneling layer; a first layer; a second layer; a third layer; and a blocking layer; wherein each of the tunneling layer, the first layer, the second layer, the third layer and the blocking layer has a band gap between a conduction band and a valence band, and each of the band gap of the tunneling layer and the blocking layer is larger than the band gap of the first, the second and the third layers; the band gap of the first layer is smaller than the band gap of the second and the third layers; and the band gap of the second layer is larger than the band gap of the first and the third layers.

In some embodiments of the present disclosure, the first layer has an atomic portion of silicon in a range from about 20% to 50%.

In some embodiments of the present disclosure, the second layer has an atomic portion of oxygen in a range from about 15% to 50%.

In some embodiments of the present disclosure, an atomic portion of oxygen in the third layer and an atomic portion of silicon in the third layer are respectively less than about 30%.

In some embodiments of the present disclosure, the gate stack further includes a gate electrode layer over the blocking layer.

In some embodiments of the present disclosure, the gate stack further includes spacers formed over sidewalls of the gate stack.

In some embodiments of the present disclosure, the third layer is the thickest layer among the first, the second and the third layers.

In some embodiments of the present disclosure, the first layer is the thinnest layer among the first, the second and the third layers.

Some embodiments of the present disclosure provide a method for manufacturing a memory device, including: providing a substrate; forming a tunneling layer over the substrate; forming a first layer over the tunneling layer; forming a second layer over the first layer; forming a third layer over the second layer; forming a blocking layer over the third layer; forming a gate electrode layer over the blocking layer; and patterning the tunneling layer, the first layer, the second layer, the third layer, the blocking layer, and the gate electrode layer to form a gate stack; wherein each of the tunneling layer and the blocking layer has an oxygen proportion higher than the first, the second and the third layers; the first layer has a highest silicon proportion among the first, the second and the third layers; the second layer has a highest oxygen proportion among the first, the second and the third layers; and the first layer has a highest nitrogen proportion among the first, the second and the third layers.

In some embodiments of the present disclosure, the method further includes forming spacers over sidewalls of the gate stack; and forming a source region and a drain region in the substrate at opposite sides of the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a substrate, including a source region and a drain region; and
   a gate stack, formed over a surface of the substrate, wherein the gate stack includes:
   a tunneling layer;
   a first layer;
   a second layer;
   a third layer; and
   a blocking layer;
   wherein each of the tunneling layer and the blocking layer has an oxygen proportion higher than the first, the second and the third layers; the first layer has a highest silicon proportion among the first, the second and the third layers; the second layer has a highest oxygen proportion among the first, the second and the third layers; and the third layer has a highest nitrogen proportion among the first, the second and the third layers.

2. The memory device of claim 1, further comprising a gate electrode layer over the blocking layer.

3. The memory device of claim 1, further comprising spacers formed over sidewalls of the gate stack.

4. The memory device of claim 1, wherein the third layer is the thickest layer among the first, the second and the third layers.

5. The memory device of claim 1, wherein the first layer is the thinnest layer among the first, the second and the third layers.

6. The memory device of claim 1, wherein the first layer has a thickness in a range of from about 5 Å to about 30 Å.

7. The memory device of claim 1, wherein the second layer has a thickness in a range of from about 10 Å to about 50 Å.

8. The memory device of claim 1, wherein the third layer has a thickness greater than about 30 Å.

9. The memory device of claim 1, wherein each of the first, the second and the third layers has a band gap between a conduction band and a valence band, and the band gap of the second layer is the largest among the band gaps of the first, the second and the third layers.

10. The memory device of claim 1, wherein each of the first, the second and the third layers has a band gap between a conduction band and a valence band, and the band gap of the first layer is the smallest among the band gaps of the first, the second and the third layers.

11. A gate stack, comprising:
a tunneling layer;
a first layer;
a second layer;
a third layer; and
a blocking layer;
wherein each of the tunneling layer, the first layer, the second layer, the third layer and the blocking layer has a band gap between a conduction band and a valence band, and each of the band gap of the tunneling layer and the blocking layer is larger than the band gap of the first, the second and the third layers; the band gap of the first layer is smaller than the band gap of the second and the third layers; and the band gap of the second layer is larger than the band gap of the first and the third layers.

12. The gate stack of claim 11, wherein the first layer has an atomic portion of silicon in a range of from about 20% to about 50%.

13. The gate stack of claim 11, wherein the second layer has an atomic portion of oxygen in a range of from about 15% to about 50%.

14. The gate stack of claim 11, wherein an atomic portion of oxygen in the third layer and an atomic portion of silicon in the third layer are respectively less than about 30%.

15. The gate stack of claim 11, further comprising a gate electrode layer over the blocking layer.

16. The gate stack of claim 11, further comprising spacers formed over sidewalls of the gate stack.

17. The gate stack of claim 11, wherein the third layer is the thickest layer among the first, the second and the third layers.

18. The gate stack of claim 11, wherein the first layer is the thinnest layer among the first, the second and the third layers.

19. A method for manufacturing a memory device, comprising: providing a substrate; forming a tunneling layer over the substrate; forming a first layer over the tunneling layer; forming a second layer over the first layer; forming a third layer over the second layer; forming a blocking layer over the third layer; forming a gate electrode layer over the blocking layer; and patterning the tunneling layer, the first layer, the second layer, the third la the blocking layer, and the gate electrode layer to form a gate stack;
wherein each of the tunneling layer and the blocking layer has an oxygen proportion higher than the first, the second and the third layers; the first layer has a highest silicon proportion among the first, the second and the third layers; the second layer has a highest oxygen proportion among the first, the second and the third layers; and the third layer has a highest nitrogen proportion among the first, the second and the third layers.

20. The method claim 19, further comprising:
forming spacers over sidewalls of the gate stack; and
forming a source region and a drain region in the substrate at opposite sides of the gate stack.

* * * * *